(12) United States Patent
Sawamoto (10) Patent No.: US 6,414,397 B1
(45) Date of Patent: Jul. 2, 2002

(54) ANISOTROPIC CONDUCTIVE FILM, METHOD OF MOUNTING SEMICONDUCTOR CHIP, AND SEMICONDUCTOR DEVICE (75) Inventor: Toshihiro Sawamoto, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/601,041
(22) PCT Filed: Dec. 2, 1999
(86) PCT No.: PCT/JP99/06794
§ 371 (c)(1), (2), (4) Date: Jul. 26, 2000
(87) PCT Pub. No.: WO00/33374
PCT Pub. Date: Jun. 8, 2000

(30) Foreign Application Priority Data

Dec. 2, 1998 (JP) .............................................. 10-343086

(51) Int. Cl.[7] ............................ H01L 23/29; H01L 23/48
(52) U.S. Cl. ....................... 257/783; 257/793; 257/795; 257/789; 438/124; 438/126; 438/127
(58) Field of Search .................................. 257/783, 778, 257/787, 789, 795, 785, 793; 438/118, 124, 126, 127

(56) References Cited

U.S. PATENT DOCUMENTS 6,137,183 A * 10/2000 Sako ........................... 257/783

FOREIGN PATENT DOCUMENTS

| JP | 60-225439 | * 11/1985 |
| JP | 4-142049 | 5/1992 |
| JP | 9-162229 | 6/1997 |
| JP | 10-98076 | 4/1998 |
| JP | 00-315855 | * 11/2000 |

* cited by examiner

Primary Examiner—Jasmine J B Clark
(74) Attorney, Agent, or Firm—Oliff & Berridge PLC (57) ABSTRACT An anisotropic conductive film includes hard portions at the two edges and a soft portion constituting the remainder. Due to such a construction, when a semiconductor chip is bonded to a substrate by thermocompression, the hard portions inhibit the soft portion from flowing toward the periphery of the semiconductor chip. Thereby, it is possible to prevent the anisotropic conductive film from adhering to a hot pressing tool.

22 Claims, 4 Drawing Sheets

ANISOTROPIC CONDUCTIVE FILM, METHOD OF MOUNTING SEMICONDUCTOR CHIP, AND SEMICONDUCTOR DEVICE

BACKGROUND OF THE INVENTION

1. Field of the Invention

The present invention relates to anisotropic conductive films, methods of mounting semiconductor chips, and semiconductor devices, and more particularly, the invention relates to an anisotropic conductive film which is suitable for mounting a semiconductor chip so that an active element-formed surface thereof faces the substrate side, a method of mounting a semiconductor chip, and a semiconductor device.

2. Description of Related Art

In a method of mounting a semiconductor chip so that a surface thereof provided with an active element faces downward, i.e., in so-called "flip chip mounting", anisotropic conductive films are often used. The anisotropic conductive film exhibits adhesive ability and also acts as a conductive medium between the semiconductor chip and the substrate. The anisotropic conductive film is a thin film and is formed as a long tape. In general, the anisotropic conductive film is composed of a binder, which is composed of a solid epoxy resin and a liquid epoxy resin, and conductive particles composed of metal-clad resin particles. The conductive particles are blended so that the volumetric ratio thereof is uniform over the binder. Additionally, metal particles may be used as the conductive particles. Conductive particles having a diameter of approximately 2 to 10 $\mu$m, and mostly approximately 5 $\mu$m, are predominantly used.

Figure 5:
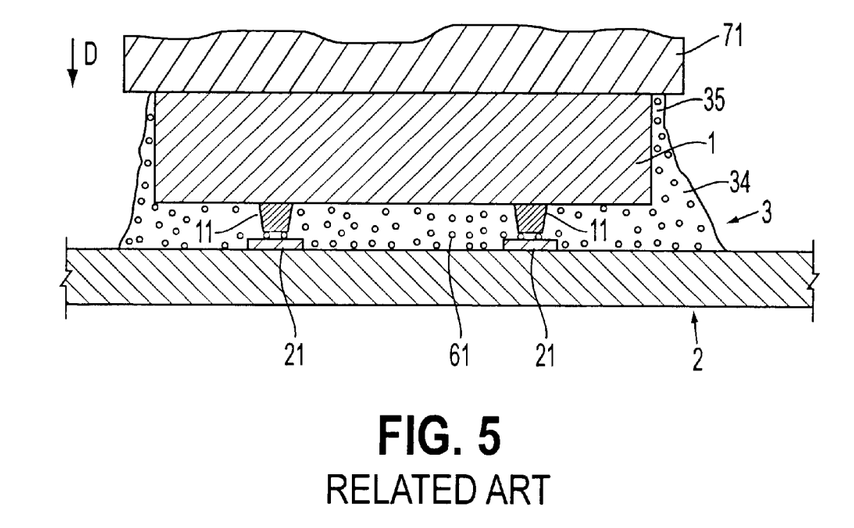
FIG. 5 is a sectional view showing the mounting state of a semiconductor chip by means of a conventional anisotropic conductive film.

Herein, an example of a method of mounting a chip using a conventional anisotropic conductive film is shown in FIG. 5. First, an anisotropic conductive film 3 is attached to a substrate 2 provided with wiring 21, and then a semiconductor chip 1 is placed on the anisotropic conductive film 3 in such a manner that electrode pads 11 and the wiring 21 are opposed to each other. Next, the semiconductor chip 1 is pressed while being heated by a hot pressing tool 71 from a surface opposite to the surface provided with the electrode pads 11.

Because of an increase in fluidity by heating, the anisotropic conductive film 3 fills the space around the electrode pads 11 and the wiring 21, and further flows out of the bond area between the semiconductor chip 1 and the substrate 2 to adhere to the sides of the semiconductor chip 1. Some conductive particles 61 are sandwiched between the electrode pads 11 and the wiring 21.

When the anisotropic conductive film 3 is cured after thermocompression, the semiconductor chip 1 and the substrate 2 are bonded together by the anisotropic conductive film 3. In particular, the anisotropic conductive film 3 adhered to the sides of the semiconductor chip 1 forms fillets 34 and strengthens mechanical connection between the semiconductor chip 1 and the substrate 2. The conductive particles 61 sandwiched between the electrode pads 11 and the wiring 21 act as conducting media between the semiconductor chip 1 and the substrate 2.

However, the conventional technique described above gives rise to the following problems.

SUMMARY OF THE INVENTION

In the case of a low-profile semiconductor chip 1, when the semiconductor chip 1 is heated and pressed by the hot pressing tool 71, the anisotropic conductive film 3 adheres not only to the sides of the semiconductor chip 1, but also to the hot pressing tool 71, as shown in FIG. 5, by an adhered portion 35. If a portion of the anisotropic conductive film 3 frequently adheres to the hot pressing tool 71, the hot pressing tool 71 must be frequently cleaned accordingly, resulting in an increase in controlling workload in the thermocompression process for the semiconductor chip. Additionally, the appearance of the semiconductor chip in such a state is unfavorable.

However, in order to avoid the problems described above, if the area of the anisotropic conductive film 3 to be provided on the substrate 2 is set smaller than the area of the semiconductor chip 1 provided with the electrode pads 11, or if the heating temperature of the hot pressing tool 71 is set lower than that in the conventional technique, the strength of mechanical connection between the semiconductor chip and the substrate may become sufficient.

DISCLOSURE OF INVENTION

In order to overcome the drawbacks in the conventional technique described above, it is an object of the present invention to provide an anisotropic conductive film in which satisfactory strength of mechanical connection between a substrate and a semiconductor chip can be obtained, and also, in which the process for connecting the semiconductor chip and the substrate can be easily controlled by preventing the anisotropic conductive film from adhering to a hot pressing tool. It is another object of the present invention to provide a circuit substrate provided with the anisotropic conductive film. It is another object of the present invention to provide an electronic apparatus provided with the circuit substrate.

It is another object of the present invention to provide a semiconductor device in which a semiconductor chip is mounted by means of an anisotropic conductive film, in which satisfactory strength of mechanical connection between a substrate and the semiconductor chip can be obtained, and which can be prevented from adhering to a hot pressing tool.

It is another object of the present invention to provide a method of mounting a semiconductor chip using the anisotropic conductive film. It is another object of the present invention to provide a semiconductor device which is fabricated by the method of mounting the semiconductor chip. It is another object of the present invention to provide an electronic apparatus provided with the semiconductor device.

In order to achieve the objects described above, an anisotropic conductive film according to an exemplary embodiment of the present invention for bonding a semiconductor chip and a substrate to each other and for acting as an electrically conductive medium between the semiconductor chip and the substrate includes a first member and a second member disposed adjacent to the first member. The first member is composed of a material having characteristics with lower fluidity than that of the second member.

In the anisotropic conductive film according to the exemplary embodiment constructed as described above, when the semiconductor chip is connected to the substrate by thermocompression bonding of the semiconductor chip to the anisotropic conductive film attached to the substrate with a hot pressing tool, the first member inhibits the second member from flowing toward the sides of the semiconductor chip. Thereby, it is possible to prevent the second member from adhering excessively to the sides of the semiconductor chip in such a manner that the adhesion reaches the hot pressing tool. Consequently, the process for connecting the semiconductor chip and the substrate can be easily controlled.

An anisotropic conductive film according to another exemplary embodiment of the present invention for bonding a semiconductor chip and a substrate to each other and for acting as an electrically conductive medium between the semiconductor chip and the substrate includes a first member and a second member disposed adjacent to the first member. The first member is composed of a material which exhibits characteristics with lower fluidity than that of the second member when the semiconductor chip and the substrate are bonded together.

In the anisotropic conductive film according to the exemplary embodiment constructed as described above, since the first member has lower fluidity than that of the second member at the point where the semiconductor chip is connected to the substrate by thermocompression bonding of the semiconductor chip to the anisotropic conductive film attached to the substrate with a hot pressing tool, the first member can inhibit the second member from flowing toward the sides of the semiconductor chip. Thereby, it is possible to prevent a material used for the second member from excessively adhering to the sides of the semiconductor chip in such a manner that the adhesion reaches the hot pressing tool. Consequently, the process for connecting the semiconductor chip and the substrate can be easily controlled.

In an anisotropic conductive film according to another exemplary embodiment of the present invention, the second member has substantially the same shape as that of a surface provided with electrodes of the semiconductor chip.

In the anisotropic conductive film according to the exemplary embodiment constructed as described above, when the semiconductor chip is connected to the substrate, the amount of the second member flowing toward each side of the semiconductor chip can be substantially equalized, and a fillet with an excessive size is not formed on a specific side.

In an anisotropic conductive film according to another exemplary embodiment of the present invention, the second member has substantially the same area as that of a surface provided with electrodes of the semiconductor chip.

In the anisotropic conductive film according to the exemplary embodiment constructed as described above, when the semiconductor chip is connected to the substrate, the amount of the second member flowing toward each side of the semiconductor chip can be suppressed to such an extent that a fillet having an appropriate size can be formed at each side.

A circuit substrate according to another exemplary embodiment of the present invention includes any one of the anisotropic conductive films described above.

In the circuit substrate according the exemplary embodiment constructed as described above, when the semiconductor chip is subjected to thermocompression bonding, the anisotropic conductive film is prevented from excessively flowing to the periphery of the semiconductor chip and adhering to the other region on the circuit substrate. The semiconductor chip can also be securely connected, and thus a highly reliable circuit substrate can be provided.

In addition, an electronic apparatus according to another exemplary embodiment of the present invention includes the circuit substrate.

In the electronic apparatus according to the exemplary embodiment constructed as described above, since the circuit substrate having high reliability in mounting a semiconductor chip is used, the reliability of the electronic apparatus itself is increased.

A semiconductor device according to another exemplary embodiment of the present invention includes a substrate on which a semiconductor chip is mounted by an anisotropic conductive film. The anisotropic conductive film includes a first member corresponding to a peripheral zone and a second member located in the, more central region in comparison with the first member. The first member is composed of a material having characteristics with lower fluidity than that of the second member.

In the semiconductor device according to the exemplary embodiment constructed as described above, when the semiconductor chip is bonded to the substrate by thermocompression, the first member inhibits the second member from flowing toward the sides of the semiconductor chip. Thereby, the second member does not excessively adhere to the sides of the semiconductor chip, and a semiconductor device having a good appearance can be provided.

In a semiconductor device according to another exemplary embodiment of the present invention, the second member has substantially the same shape as that of a surface provided with electrodes of the semiconductor chip.

In the semiconductor device according to the exemplary embodiment constructed as described above, the amount of the second member flowing toward each side of the semiconductor chip can be substantially equalized, and a fillet with an excessive size is not formed on a specific side.

In a semiconductor device according to another exemplary embodiment of the present invention, the second member has substantially the same area as that of a surface provided with the electrodes of the semiconductor chip.

In the semiconductor device according to another exemplary embodiment constructed as described above, when the semiconductor chip and the substrate are connected to each other, the amount of the second member flowing toward each side of the semiconductor chip can be suppressed to such an extent that a fillet having an appropriate size can be formed at each side.

A method of mounting a semiconductor chip according to another exemplary embodiment of the present invention so that one surface provided with electrodes of the semiconductor chip is opposed to a surface provided with electrodes of a substrate includes the steps of attaching an anisotropic conductive film including a first member and a second member disposed adjacent to the first member to the surface provided with the electrodes of the substrate, placing the semiconductor chip on the anisotropic conductive film, and connecting the semiconductor chip to the substrate by pressing the semiconductor chip while heating by a hot pressing member.

In the method of mounting the semiconductor chip according to the exemplary embodiment as described above, when, the semiconductor chip is connected to the substrate by thermocompression bonding of the semiconductor chip to the anisotropic conductive film attached to the substrate with a hot pressing tool, the first member inhibits the second member, having higher fluidity than that of the first member, from flowing toward the sides of the semiconductor chip. Thereby, it is possible to prevent the second member from excessively adhering to the sides of the semiconductor chip in such a manner that the adhesion reaches the hot pressing tool. Consequently, the process for connecting the semiconductor chip and the substrate can be easily controlled.

In a method of mounting a semiconductor chip according to another exemplary embodiment of the present invention, the first member has characteristics with lower fluidity than that of the second member.

In the method of mounting the semiconductor chip according to the exemplary embodiment as described above, the first member can securely inhibit the second member from flowing toward the sides of the semiconductor chip, and the adhesion of the second member to the hot pressing tool can be prevented.

In a method of mounting a semiconductor chip according to another exemplary embodiment of the present invention, the second member has substantially the same shape as that of the one surface described above.

In the method of mounting the semiconductor chip according to the above exemplary embodiment, the amount of the second member flowing toward each side of the semiconductor chip can be substantially equalized, and a fillet with an excessive size is not formed at a specific side.

In a method of mounting a semiconductor chip according to another exemplary embodiment of the present invention, the second member has substantially the same area as that of the one surface described above.

In the method of mounting the semiconductor chip according to the above exemplary embodiment, when the semiconductor chip and the substrate are connected to each other, the amount of the second member flowing toward each side of the semiconductor chip can be suppressed to such an extent that a fillet having an appropriate size can be formed at each side.

A method of mounting a semiconductor chip according to another exemplary embodiment of the present invention for mounting the semiconductor chip so that one surface provided with electrodes of the semiconductor chip is opposed to a surface provided with electrodes of a substrate includes the steps of heating a region located more centrally from a peripheral zone of an anisotropic conductive film comprised of a thermoplastic resin to increase the fluidity of the anisotropic conductive film, attaching the anisotropic conductive film to the surface provided with the electrodes of the substrate, placing the semiconductor chip on the anisotropic conductive film, and connecting the semiconductor chip to the substrate by pressing the semiconductor chip while heating by a hot pressing member.

In the method of mounting the semiconductor chip according to the above exemplary embodiment, since the fluidity of the heated region is increased, in the step of connecting the semiconductor chip to the substrate, the heated region flows toward the sides of the semiconductor chip, and also the unheated region suppresses the excessive flow thereof. Thereby, it is possible to prevent the anisotropic conductive film from excessively adhering to the sides of the semiconductor chip and reaching a hot pressing tool. Consequently, the process for connecting the semiconductor chip and the substrate can be easily controlled.

In a method of mounting a semiconductor chip according to another exemplary embodiment of the present invention, the anisotropic conductive film is formed so that the region has substantially the same shape as that of the one surface described above.

In the method of mounting the semiconductor chip according to the above exemplary embodiment constructed as described above, the amount of the second member flowing toward each side of the semiconductor chip can be substantially equalized, and a fillet with an excessive size is not formed on a specific side.

A method of mounting a semiconductor chip according to another exemplary embodiment of the present invention for mounting the semiconductor chip so that one surface provided with electrodes of the semiconductor chip is opposed to a surface provided with electrodes of a substrate includes the steps of attaching a frame-shaped anisotropic conductive film to the surface provided with the electrodes of the substrate, providing an anisotropic conductive adhesive having higher fluidity than that of the anisotropic conductive film in the region inside the anisotropic conductive film, placing the semiconductor chip on the anisotropic conductive adhesive, and connecting the semiconductor chip to the substrate by pressing the semiconductor chip while heating by a hot pressing member.

In the method of mounting the semiconductor chip according to the exemplary embodiment constructed as described above, when the semiconductor chip and the substrate are connected to each other by thermocompression bonding of the semiconductor chip to the anisotropic conductive film attached to the substrate by a hot pressing tool, the frame-shaped anisotropic conductive film inhibits the anisotropic conductive adhesive in the interior region from flowing toward the sides of the semiconductor chip. Thereby, it is possible to prevent the anisotropic conductive adhesive from excessively adhering to the sides of the semiconductor chip and reaching the hot pressing tool. Consequently, the process for connecting the semiconductor chip and the substrate can be easily controlled.

In a method of mounting a semiconductor chip according to another exemplary embodiment of the present invention, the region inside the anisotropic conductive film has substantially the same shape as that of one surface described above.

In the method of mounting the semiconductor chip according to the above exemplary embodiment, when the semiconductor chip and the substrate are connected to each other, even if the anisotropic conductive adhesive flows toward the sides of the semiconductor chip, since the flowing amount is too small to form fillets having an excessive size, the anisotropic conductive film does not adhere to, the hot pressing tool.

A semiconductor device according to another exemplary embodiment of the present invention is fabricated by the method of mounting a semiconductor chip according to any one of the above exemplary embodiments.

In the semiconductor device according to the above exemplary embodiment constructed as described above, the reliability in connecting the semiconductor chip can be increased, and the size of the fillets formed at the sidles of the semiconductor chip can be set in response to the height of the semiconductor chip to be mounted. Consequently, it is possible to provide a semiconductor device having high reliability in connecting the semiconductor chip and the substrate and also having good appearance.

Furthermore, an electronic apparatus according to another exemplary embodiment of the present invention includes the semiconductor device according to the above exemplary embodiment.

In the electronic apparatus according to the exemplary embodiment constructed as above, since the semiconductor device in which fillets having an appropriate size are formed and which has satisfactory mechanical connection is included, the functional reliability of the electronic apparatus is enhanced.

With respect to the material for the substrate in each means described above, a substrate composed of an organic material, such as a plastic substrate or a flexible substrate, or a substrate composed of an inorganic material, such as a ceramic substrate, may be used.

BRIEF DESCRIPTION OF THE DRAWINGS

FIGS. 2(A) to 2(C) are sectional views showing the mounting steps of the semiconductor chip in accordance with the first embodiment of the present invention, in which

FIGS. 3(A) to 3(C) are sectional views showing the mounting steps of a semiconductor chip in accordance with a second embodiment of the present invention, in which

DETAILED DESCRIPTION OF THE EMBODIMENTS

Preferred embodiments of the present invention will be described in detail with reference to the drawings.

Figure 1:
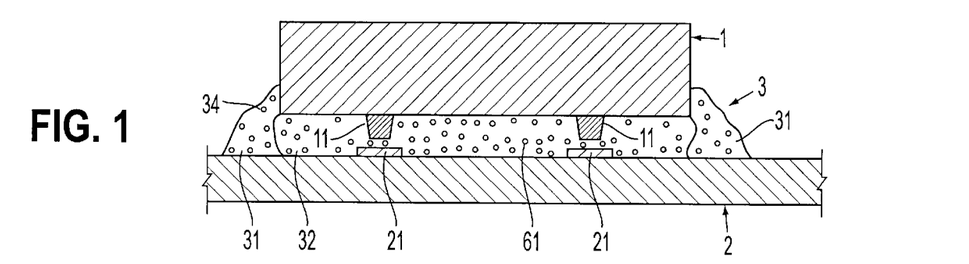
FIG. 1 is a sectional view which shows the mounting state of a semiconductor chip in accordance with a first embodiment of the present invention.
Figure 2A:
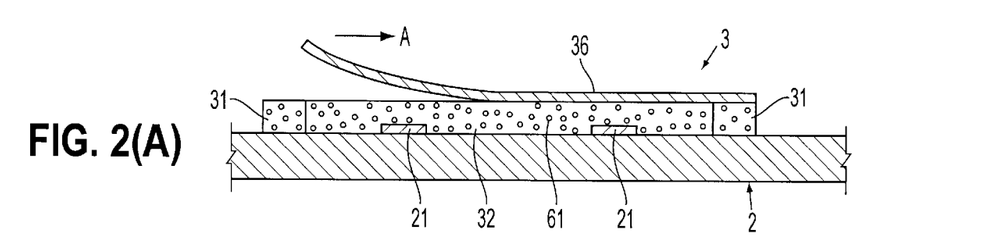
FIG. 2(A) is a sectional view showing a state in which an anisotropic conductive film is attached to a substrate.
Figure 2B:
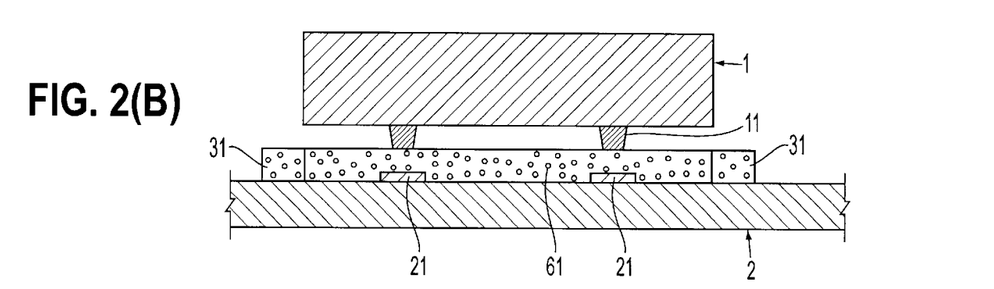
FIG. 2(B) is a sectional view showing a state in which the semiconductor chip is placed on the anisotropic conductive film.
Figure 2C:
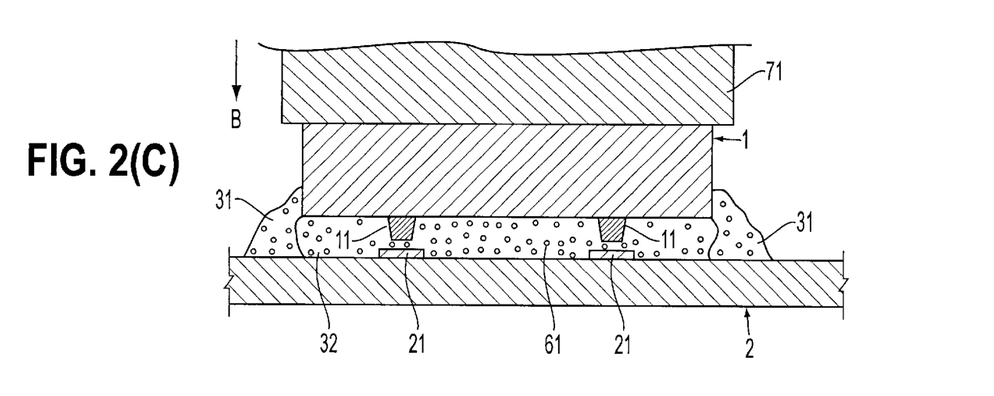
FIG. 2(C) is a sectional view showing a state in which the semiconductor chip is being subjected to thermocompression bonding.
Figure 3A:
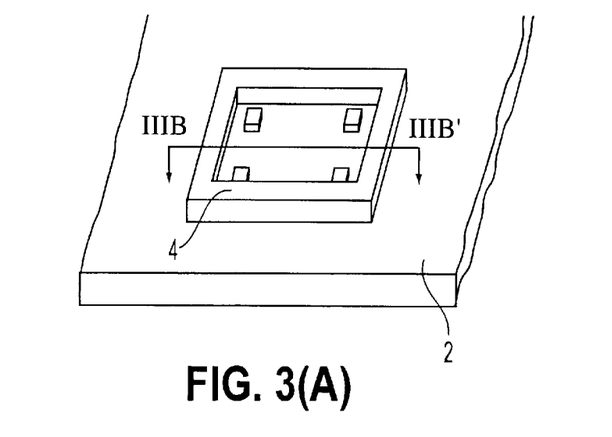
FIG. 3(A) is a perspective view showing a state in which an anisotropic conductive film is attached to a substrate.
Figure 3B:
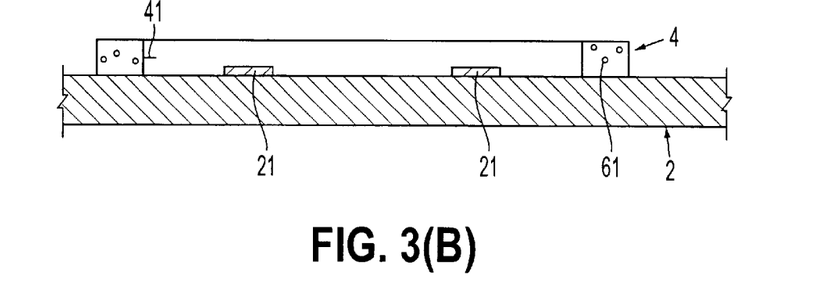
FIG. 3(B) is a sectional view taken along the line IIIB–IIIB' of FIG. 3(A)
Figure 3C:
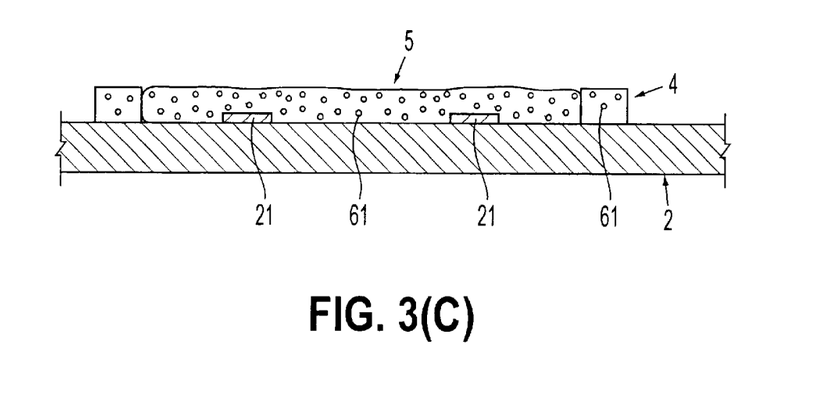
FIG. 3(C) is a sectional view showing a state in which an anisotropic conductive adhesive paste is applied to the region inside the anisotropic conductive film.
Figure 4:
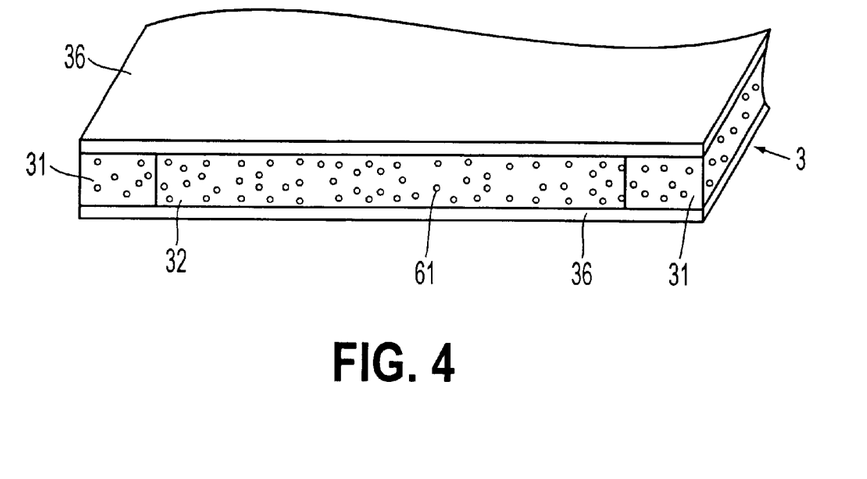
FIG. 4 is a perspective view of the anisotropic conductive film in accordance with the first embodiment of the present invention.
Figure 6:
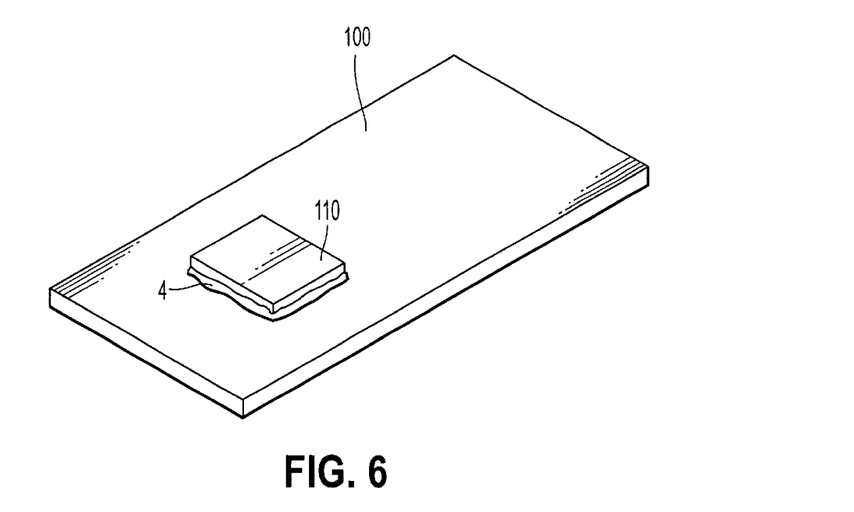
FIG. 6 is a schematic diagram of a circuit substrate on which a semiconductor chip is mounted by means of an anisotropic conductive film in accordance with any one of the embodiments of the present invention.
Figures 7, 8:
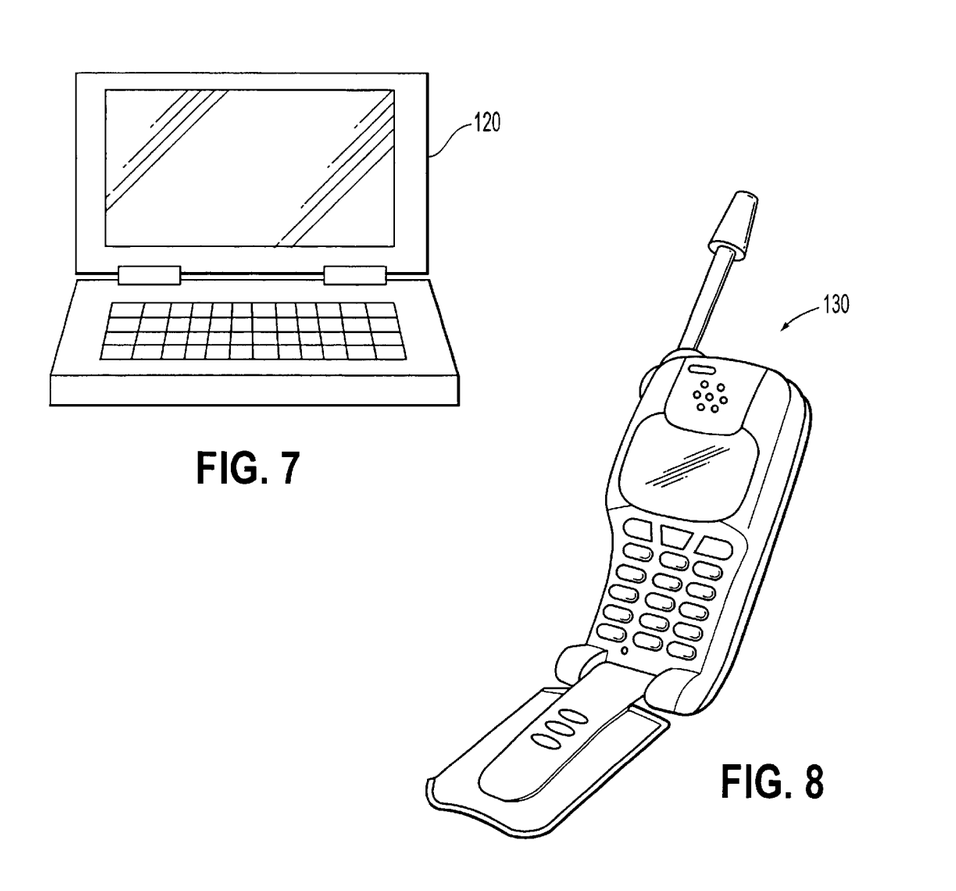
FIG. 7 is a schematic diagram of a notebook-sized personal computer in accordance with an embodiment of the present invention.
FIG. 8 is a schematic diagram of a mobile phone in accordance with an embodiment of the present invention.

FIG. 1 is a sectional view which shows the mounting state of a semiconductor chip in accordance with a first embodiment of the present invention. FIGS. 2(A) to 2(C) are sectional views showing the mounting steps of the semiconductor chip in accordance with god the first embodiment of the present invention, in which FIG. 2(A) is a sectional view showing a state in which an anisotropic conductive film is attached to a substrate, FIG. 2(B) is a sectional views showing a state in which the semiconductor chip is placed on the anisotropic conductive film, and FIG. 2(C) is a sectional view showing a state in which the semiconductor chip is being subjected to thermocompression bonding. FIGS. 3(A) to 3(C) are sectional views showing the mounting steps of a semiconductor chip in accordance with a second embodiment of the present invention, in which FIG. 3(A) is a perspective view showing a state in which an anisotropic conductive film is attached to a substrate, FIG. 3(B) is a sectional view thereof, and FIG. 3(C) is a sectional view showing a state in which an anisotropic, conductive adhesive paste is applied to the region inside the anisotropic conductive film. FIG. 4 is a perspective view of the anisotropic conductive film in accordance with the first embodiment of the present invention. FIG. 5 is a sectional view showing the mounting state of a semiconductor chip by means of a conventional anisotropic conductive film. FIG. 6 is a schematic diagram of a circuit substrate on which a semiconductor chip is mounted by means of an anisotropic conductive film in accordance with any one of the embodiments of the present invention. FIG. 7 is a schematic diagram of a notebook-sized personal computer in accordance with an embodiment of the present invention. In addition, FIG. 8 is a schematic diagram of a mobile phone in accordance with an embodiment of the present invention.

First, a specific structure of an anisotropic conductive film in the first embodiment of the present invention will be described. As shown in FIG. 4, an anisotropic conductive film 3 is formed in a sheet, and the entire film is in the shape of a long tape. FIG. 4 shows a portion thereof, and the anisotropic conductive film 3 includes hard portions 31 disposed at the two ends in the longitudinal direction and a soft portion 32 disposed in a block between the two hard portions 31. Cover films 36 are attached to the front and back thereof.

The hard portions 31 are composed of a high molecular weight thermosetting resin and have characteristics of low fluidity when heated. The soft portion 32 is composed of a low molecular weight thermosetting resin and has characteristics of high fluidity relative to the hard portions 31 when heated. Specifically, the hard portions 31 are composed of epoxy resins, in which 75% to 99% by weight of a solid epoxy resin and 1% to 25% by weight of a liquid epoxy resin are mixed. The soft portion 32 is composed of epoxy resins, in which 50% to 75% by weight of a solid epoxy resin and 25% to 50% by weight of a liquid epoxy resin are mixed.

Additionally, when a semiconductor chip or the like is mounted using the anisotropic conductive film 3, the anisotropic conductive film is usually heated at 180° C. to 200° C. When in use, the anisotropic conductive film is cut to an appropriate size, the cover film 36 at the substrate side is detached, and the anisotropic conductive film is attached to the position on which the semiconductor chip is to be mounted.

The width of the soft portion 32 is preferably set to a length that is the same as the shorter side of a semiconductor chip to be mounted, if the semiconductor chip is rectangular. The reason for this is that when the semiconductor chip 1 is bonded to the substrate 2 by thermocompression, although the soft portion 32 flows out from the space between the semiconductor chip 1 and the substrate 2 to an exterior space because the fluidity of the soft portion 32 is greatly increased, if the width of the soft portion 32 is set at the width described above, the hard portions 31 act like a lid to shut off the space between the semiconductor chip 1 and the substrate 2 from the exterior space, and the soft portion 32 is inhibited from flowing out to the exterior space.

The semiconductor chip is provided with several tens to several hundreds of electrode pads with a predetermined distance therebetween at two or four sides of the electrode-pad-formed surface or over the entire surface. In the embodiment of the present invention, the electrode pads may be provided in either state. The substrate on which the semiconductor chip is mounted may be composed of an organic material or an inorganic material, and there is no limitation on the material to be used.

Next, the method of mounting the semiconductor chip using the anisotropic conductive film 3 in accordance with the first embodiment of the present invention will be described with reference to the drawings.

As shown in FIG. 2(A), first, the anisotropic conductive film 3 from which the cover film 36 at the side of the substrate 2 has been detached is attached to the substrate 2 provided with the wiring 21 while heating at 180° C. to 200° C. for several seconds. Next, the cover film 36 at the side for receiving the semiconductor chip 1 is detached. The length of the soft portion 32 is set at substantially the same as that of the long side of the semiconductor chip 1.

Next, as shown, in FIG. 2(B), the semiconductor chip 1 is placed on the anisotropic conductive film 3 so that the electrode pads 11 and the wiring 21 are opposed to each other. The anisotropic conductive film 3 is placed so that the long side of the semiconductor chip 1 and the hard portions 31 are substantially parallel to each other.

As shown in FIG. 2(C), the semiconductor chip 1 is pressed and heated by a hot pressing tool 71. The fluidity of the anisotropic conductive film 3 increases due to heating, and is deformed by the pressure. Additionally, since the heat from the hot pressing tool 71 is transmitted well to the electrodes pads 11 composed of a metal, the fluidity is particularly increased with respect to the anisotropic conductive film 3 in the periphery of the electrode pads 11.

When heating is performed in such a manner, the soft portion 32 flows from the space between the semiconductor chip 1 and the substrate 2 to the sides of the semiconductor chip 1 due to the pressure of the hot pressing tool 71 (as shown by an arrow B). However, since the hard portions 31 are provided below the long sides of the semiconductor chip 1, the flow of the soft portion 32 is suppressed by the hard portions 31. Therefore, the soft portion 32 squeezed out from the space between the semiconductor chip 1 and the substrate 2 is prevented from adhering to the hot pressing tool 71.

On the other hand, since there is nothing that inhibits the soft portion 32 from flowing below the short sides among the four sides of the semiconductor chip 1, the soft portion 32 flows towards the sides of the semiconductor chip 1. However, as described above, the heat from the hot pressing tool 71 is well transmitted to the electrodes pads 11. Thereby, when the semiconductor chip 1 is rectangular, since the number of electrode pads 11 provided at the short sides is smaller than that provided at the long sides, that is, since the heat applied is small, the soft portion 32 below the short sides has lower fluidity than that of the soft portion 32 below the long sides. Furthermore, since the soft portion 32 has a length that is the same as that of the semiconductor chip 1, a source of adherence to the sides of the semiconductor chip 1 is not provided on the periphery of the semiconductor chip 1.

That is, what adheres to the two sides of the semiconductor chip 1 is limited to that flowing from the space between the semiconductor chip 1 and the substrate 2. Accordingly, the amount adhered to the semiconductor chip 1 is decreased, and the fluidity is not increased so much, and thus, the possibility of adhering up to the hot pressing tool 71 is greatly decreased. Therefore, fillets are not formed excessively at the short sides of the semiconductor chip 1, either.

Consequently, when the semiconductor chip 1 is bonded to the substrate 2 by thermocompression by the process described above, the anisotropic conductive film 3 does not adhere to the hot pressing tool 71. As shown in FIG. 1, fillets 34 are formed with an appropriate size without reaching the height of the backside of the semiconductor chip.

Additionally, although the anisotropic conductive film is composed of two thermosetting resins having different fluidity in the first embodiment of the present invention, the same effect may be obtained if the fluidity of a predetermined portion can be set different from that of the other portion in one anisotropic conductive film. Therefore, for example, as a variation on the first embodiment, assuming that the anisotropic conductive film is formed of a thermoplastic resin composed of a single material, by preheating a portion corresponding to the soft portion 32 in the first embodiment before thermocompression bonding of the semiconductor chip to increase fluidity, and then by performing thermocompression bonding of the semiconductor chip, a portion not preheated functions the same as the hard portions 31, and thus an effect similar to that in the first embodiment of the present invention can be obtained.

In the above variation, if the entire periphery of the anisotropic conductive film is not preheated, since the entire periphery functions the same as the hard portions 31, the flow of the preheated portion can be suppressed more securely.

Next, an anisotropic conductive film in the second embodiment of the present invention will be described with reference to FIGS. 3(A) to 3(C). As shown in FIGS. 3(A) and 3(B), the anisotropic conductive film is shaped as a frame as illustrated by an anisotropic conductive film 4. The anisotropic conductive film 4 is attached to a substrate 2. The anisotropic conductive film 4 is composed of a thermosetting resin. An interior region of the anisotropic conductive film 4 has substantially the same shape as that of a semiconductor chip 1, and also has substantially the same area as or a slightly larger area than that of the semiconductor chip 1.

Next, as shown in FIG. 3(C), an anisotropic conductive adhesive paste 5 is applied entirely to a recess 41, which corresponds to the interior region of the anisotropic conductive film 4, so that the anisotropic conductive adhesive paste 5 has substantially the same height as that of the frame-shaped anisotropic conductive film 4. The semiconductor chip 1 is then placed on the anisotropic conductive adhesive paste 5. After this, in a manner similar to that of the first embodiment, the semiconductor chip 1 is pressed and heated by a hot pressing tool 71 from the opposite surface to the surface provided with electrode pads 11 of the semiconductor chip 1.

By the process described above, the semiconductor chip is mounted. Additionally, in this embodiment, when the semiconductor chip 1 is placed on the anisotropic conductive additive paste 5, by fitting the semiconductor chip 1 into the recess 41, the semiconductor chip 1 can be simultaneously aligned. Accordingly, in this embodiment, the alignment process, in the placement of the semiconductor chip 1 can be simplified.

In accordance with the construction described above, since the anisotropic conductive adhesive paste 5 has a higher fluidity than that of the frame-shaped anisotropic conductive film 4, the anisotropic conductive adhesive paste 5 flows toward the sides of the semiconductor chip 1. However, since the frame-shaped anisotropic conductive film 4 inhibits the anisotropic conductive adhesive paste 5 from flowing, the anisotropic conductive adhesive paste 5 can be prevented from adhering to the hot pressing tool 71. In this embodiment, since the anisotropic conductive adhesive paste 5 is securely inhibited from flowing at the four sides of the semiconductor chip 1, the invention is preferably applicable to a case in,which the semiconductor chip 1 is square.

Accordingly, in this embodiment, the anisotropic conductive film 4 does not adhere to the hot pressing tool 71, either, and in a manner similar to that of the first embodiment, fillets 34 with an appropriate size are formed at the sides of the semiconductor chip 1. In this embodiment, instead of applying the anisotropic conductive adhesive paste 5 into the recess 41, an anisotropic conductive film having higher fluidity than that of the anisotropic conductive film 4 may be cut so as to have substantially the same shape and substantially the same area as that of the recess 41 and may be attached in the recess 41. Furthermore, an anisotropic conductive film having higher fluidity than that of the anisotropic conductive film 4 may be preliminarily provided in the recess 41.

As conductive particles 61 to be included in the anisotropic conductive adhesives in the individual embodiments described above, any types of particles, such as metal particles or metal-clad resin particles, may be used, and there is no limitation to the material or the shape thereof Additionally, instead of providing bumps on the electrodes of the semiconductor chip, bumps may be provided on the electrodes of the substrate.

In the embodiments described above, although electrodes are provided at all four sides of the surface provided with the electrodes of the semiconductor chip, the placement of the electrodes is not limited to this, and the electrodes may be provided at two sides only or on the entire surface.

As described above, in the embodiments of the present invention, when the semiconductor chip is bonded to the substrate by thermocompression, the anisotropic conductive film does not adhere to the hot pressing tool. Since fillets having an appropriate size and good appearance can be formed at the sides of the semiconductor chip, the reliability of mechanical connection between the semiconductor chip and the substrate is increased. Additionally, with respect to the second embodiment of the present invention, since the anisotropic conductive film is shaped as a frame, by placing the semiconductor chip within the frame, the alignment of the semiconductor chip is simultaneously completed, and thus, the process of aligning the semiconductor chip can be easily controlled.

Furthermore, FIG. 6 is referred to as an example of a semiconductor chip mounted using the anisotropic conductive film described above. That is, FIG. 6 shows a circuit substrate 100 to which a semiconductor chip 110 is mounted using an anisotropic conductive film 4 in accordance with any one of embodiments of the present invention. Additionally, as the circuit substrate 100, for example, an organic substrate, such as a glass epoxy substrate, is generally used. The circuit substrate 100 is provided with a bonding section, for example, composed of copper, so as to form a predetermined circuit. By mechanically connecting the bonding section and external electrodes of the semiconductor chip 110, electrical conduction therebetween is obtained.

In the semiconductor chip 110, the mounting area can be reduced to an area in which mounting is performed by a bare chip, and by using the circuit substrate 100 for an electronic apparatus, the size of the electronic apparatus itself can be reduced. Within the same area, more mounting space can be secured, resulting in higher performance.

As electronic apparatuses provided with the circuit substrate 100, a notebook-sized personal computer 120 is shown in FIG. 7 and a mobile phone 130 is shown in FIG. 8.

Industrial Applicability

As described above, in one aspect of the present invention, an anisotropic conductive film for bonding a semiconductor chip and a substrate to each other and for acting as an electrically conductive medium between the semiconductor chip and the substrate includes a first member and a second member disposed adjacent to the first member. Since the first member is composed of a material having lower fluidity than that of the second member; the first member suppresses the flow of the second member and prevents the anisotropic conductive film from adhering to a hot pressing tool. Consequently, the efficient process for mounting the semiconductor chip can be obtained, and also the appearance of the mounted semiconductor chip can be improved.

In another aspect, an anisotropic conductive film for bonding a semiconductor chip and a substrate to each other and for acting as an electrically conductive medium between the semiconductor chip and the substrate includes a first member and a second member disposed adjacent to the first member. Since the first member is composed of a material which exerts characteristics with lower fluidity than that of the second member when the semiconductor chip and the substrate are bonded together, the first member suppresses the flow of the second member and prevents the anisotropic conductive film from adhering to a hot pressing tool when the semiconductor chip is joined to the substrate. Consequently, the efficient process for mounting the semiconductor chip can be obtained, and also the appearance of the mounted semiconductor chip can be improved.

In another aspect, in a semiconductor device provided with a substrate to which a semiconductor chip is mounted by means of an anisotropic conductive film, the anisotropic conductive film includes a first member corresponding to a peripheral zone and a second member located in the more central region in comparison with the first member. Since the first member is composed of a material having characteristics with lower fluidity than that of the second member, the first member suppresses the flow of the second member and prevents the anisotropic conductive film from adhering to a hot pressing tool, and the frequency of cleaning the hot pressing tool can be greatly decreased. Consequently, the efficient process for mounting the semiconductor chip can be obtained, and also the appearance of the mounted semiconductor chip can be improved.

In another aspect, in a semiconductor device provided with a substrate to which a semiconductor chip is mounted by means of an anisotropic conductive film, the anisotropic conductive film includes a first member corresponding to a peripheral zone and a second member located in the more central region in comparison with the first member. Since the first member is composed of a material which exerts characteristics with lower fluidity than that of the second member, the first member suppresses the flow of the second member and prevents the anisotropic conductive film from adhering to a hot pressing tool, and the frequency of cleaning the hot pressing tool can be greatly reduced. Consequently, the efficient process for mounting the semiconductor chip can be obtained, and also the appearance of the mounted semiconductor chip can be improved.

In another aspect, a method of mounting a semiconductor chip so that one surface provided with electrodes of the semiconductor chip is opposed to a surface provided with electrodes of a substrate, includes the steps of attaching an anisotropic conductive film including a first member and a second member disposed adjacent to the first member to the surface provided with the electrodes of the substrate, placing the semiconductor chip on the anisotropic conductive film, and connecting the semiconductor chip to the substrate by pressing the semiconductor chip while heating by a hot pressing member. Thereby, the first member suppresses the flow of the second member and prevents the anisotropic conductive film from adhering to a hot pressing tool, and the frequency of cleaning the hot pressing tool can be greatly reduced. Consequently, the efficient process for mounting the semiconductor chip can be obtained, and also the appearance of the mounted semiconductor chip can be improved.

In another aspect, a method of mounting a semiconductor chip so that one surface provided with electrodes of the semiconductor chip is opposed to a surface provided with electrodes of a substrate, includes the steps of heating a region located more centrally from a peripheral zone of an anisotropic conductive film composed of a thermoplastic resin to increase the fluidity of the anisotropic conductive film, attaching the anisotropic conductive film to the surface provided with the electrodes of the substrate, placing the semiconductor chip on the anisotropic conductive film, and connecting the semiconductor chip to the substrate by pressing the semiconductor chip while heating by a hot pressing member. Accordingly, the anisotropic conductive film is prevented from adhering to a hot pressing tool, and the process of aligning the mounting position of the semiconductor chip can be simplified. Consequently, the peripheral zone of the anisotropic conductive film suppresses the flow of the central region, the anisotropic conductive film is prevented from adhering to the hot pressing tool, and the frequency of cleaning the hot pressing tool can be greatly reduced. Consequently, efficiency in the process for mounting the semiconductor chip can be obtained, and also the appearance of the mounted semiconductor chip, can be improved.

In another aspect, a method of mounting a semiconductor chip so that one surface provided with electrodes of the semiconductor chip is opposed to a surface provided with electrodes of a substrate includes the steps of attaching a frame-shaped anisotropic conductive film to the surface provided with the electrodes of the substrate, providing an anisotropic conductive adhesive having higher fluidity than that of the anisotropic conductive film in the region inside the anisotropic conductive film, placing the semiconductive chip on the anisotropic conductive adhesive, and connecting the semiconductor chip to the substrate by pressing the semiconductor chip while heating by a hot pressing member. Accordingly, the alignment of the semiconductor chip can be simplified, and the efficient process for mounting the semiconductor chip can be obtained. Furthermore, the appearance of the mounted semiconductor chip can be improved.

What is claimed is:

1. An anisotropic conductive film that bonds a semiconductor chip and a substrate to each other and that acts as an electrically conductive medium between the semiconductor chip and the substrate, the anisotropic conductive film comprising:
   a first member; and
   a second member disposed adjacent to the first member, the first member comprising a material having characteristics with lower fluidity than that of the second member,
   wherein the first member inhibits the second member from flowing towards the sides of the semiconductor chip.

2. The anisotropic conductive film according to claim 1, the second member having substantially the same shape as that of a surface provided with electrodes of the semiconductor chip.

3. A circuit substrate comprising the anisotropic conductive film according to claim 1.

4. The anisotropic conductive film according to claim 2, the second member having substantially the same area as that of the surface provided with the electrodes of the semiconductor chip.

5. An electronic apparatus comprising the circuit substrate according to claim 3.

6. An anisotropic conductive film that bonds a semiconductor chip and a substrate to each other and that acts as an electrically conductive medium between the semiconductor chip and the substrate, the anisotropic conductive film comprising:
   a first member; and
   a second member disposed adjacent to the first member, the first member comprising a material which exhibits characteristics with lower fluidity than that of the second member during a process of bonding the semiconductor chip and the substrate together,
   wherein the first member inhibits the second member from flowing towards the sides of the semiconductor chip.

7. A semiconductor device, comprising:
   a substrate;
   a semiconductor chip mounted on the substrate; and
   an anisotropic conductive film that bonds the semiconductor chip and the substrate to each other, the anisotropic conductive film comprising a first member corresponding to a peripheral zone and a second member located in a more central region in comparison with the first member, and the first member comprising a material having characteristics with lower fluidity than that of the second member.

8. The semiconductor device according to claim 7, the second member having substantially the same shape as that of a surface provided with electrodes of the semiconductor chip.

9. The semiconductor device according to claim 8, the second member having substantially the same area as that of the surface provided with the electrodes of the semiconductor chip.

10. A semiconductor device, comprising:
    a substrate;
    a semiconductor chip mounted on the substrate; and
    an anisotropic conductive film that bonds the semiconductor chip and the substrate to each other, the anisotropic conductive film comprising a first member corresponding to a peripheral zone and a second member located in a more central region in comparison with the first member, and the first member comprising a material which exhibits characteristics with lower fluidity than that of the second member when the semiconductor chip and the substrate are bonded together.

11. A method of mounting a semiconductor chip on a substrate so that one surface provided with electrodes of the semiconductor chip is opposed to a surface provided with electrodes of the substrate, the method comprising the steps of:
    attaching an anisotropic conductive film comprising a first member and a second member disposed adjacent to the first member to the surface provided with the electrodes of the substrate, the first member inhibiting the second member from flowing towards the sides of the semiconductor chip;
    placing the semiconductor chip on the anisotropic conductive film; and
    connecting the semiconductor chip to the substrate by pressing the semiconductor chip while heating by a hot pressing member.

12. The method of mounting a semiconductor chip according to claim 11, the first member having characteristics with lower fluidity than that of the second member.

13. The method of mounting a semiconductor chip according to one claim 11, the second member having substantially the same shape as that of said one surface.

14. A semiconductor device fabricated by the method of mounting a semiconductor chip according to claim 11.

15. The method of mounting a semiconductor chip according to claim 13, the second member having substantially the same area as that of said one surface.

16. An electronic apparatus, comprising the semiconductor device according to claim 14.

17. A method of mounting a semiconductor chip on a substrate so that one surface provided with electrodes of the semiconductor chip is opposed to a surface provided with electrodes of the substrate, the method comprising the steps of:

heating a region located more centrally from a peripheral zone of an anisotropic conductive film comprising a thermoplastic resin to increase fluidity of the anisotropic conductive film;

attaching the anisotropic conductive film to the surface provided with the electrodes of the substrate;

placing the semiconductor chip on the anisotropic conductive film; and connecting the semiconductor chip to the substrate by pressing the semiconductor chip while heating by a hot pressing member.

18. The method of mounting a semiconductor chip according to claim 17, the anisotropic conductive film being formed so that the region has substantially the same shape as that of said one surface.

19. A method of mounting a semiconductor on a substrate chip so that one surface provided with electrodes of the semiconductor chip is opposed to a surface provided with electrodes of the substrate, the method comprising the steps of:

attaching a frame-shaped anisotropic conductive film to the surface provided with the electrodes of the substrate;

providing an anisotropic conductive adhesive having higher fluidity than that of the anisotropic conductive film in a region inside the anisotropic conductive film;

placing the semiconductor chip on the anisotropic conductive adhesive; and connecting the semiconductor chip to the substrate by pressing the semiconductor chip while heating by a hot pressing member.

20. The method of mounting a semiconductor chip according to claim 19, the region inside the anisotropic conductive film having substantially the same shape as that of said one surface.

21. An anisotropic conductive film that bonds a semiconductor chip and a substrate to each other and that acts as an electrically conductive medium between the semiconductor chip and the substrate, the anisotropic film comprising:

a first member composed of epoxy resin in which 75% to 99% by weight of a solid epoxy resin and 1% to 25% by weight of a liquid epoxy resin are mixed; and a second member composed of epoxy resin in which 50% to 75% by weight of a solid epoxy resin and 25% to 50% by weight of a liquid epoxy resin are mixed;

wherein the first member is disposed at the side of the second member.

22. A method of mounting a semiconductor chip so that one surface provided with electrodes of the semiconductor chip is opposed to a surface provided with electrodes of the substrate, the method comprising the steps of:

attaching an anisotropic conductive film comprising a first member and a second member, wherein the first member is composed of epoxy resin in which 75% to 99% by weight of a solid epoxy resin and 1% to 25% by weight of a liquid epoxy resin are mixed, and wherein the second member is composed of epoxy resin in which 50% to 75% by weight of a solid epoxy resin and 25% to 50% by weight of a liquid epoxy resin are mixed, wherein the first member is disposed at the side of the second member;

placing the semiconductor chip on the anisotropic conductive film; and connecting the semiconductor chip to the substrate by pressing the semiconductor chip while heating by a hot pressing member.

* * * * *